United States Patent
Adachi et al.

(10) Patent No.: US 10,697,090 B2
(45) Date of Patent: Jun. 30, 2020

(54) THIN-FILM STRUCTURAL BODY AND METHOD FOR FABRICATING THEREOF

(71) Applicant: Panasonic Intellectual Property Management Co., Ltd., Osaka (JP)

(72) Inventors: Hideaki Adachi, Osaka (JP); Ryouichi Takayama, Osaka (JP); Takakiyo Harigai, Kyoto (JP); Yoshiaki Tanaka, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 233 days.

(21) Appl. No.: 15/872,967

(22) Filed: Jan. 16, 2018

(65) Prior Publication Data

US 2018/0371642 A1  Dec. 27, 2018

(30) Foreign Application Priority Data

Jun. 23, 2017 (JP) .................................. 2017-123461

(51) Int. Cl.
 *C30B 29/68* (2006.01)
 *H01L 41/312* (2013.01)
 (Continued)

(52) U.S. Cl.
 CPC ............ *C30B 29/68* (2013.01); *C30B 23/025* (2013.01); *C30B 29/16* (2013.01); *C30B 29/20* (2013.01);
 (Continued)

(58) Field of Classification Search
 CPC .......... C30B 29/68; C30B 29/16; C30B 29/20; C30B 23/025; C30B 29/32; C30B 29/26;
 (Continued)

(56) References Cited

U.S. PATENT DOCUMENTS

| | | |
|---|---|---|
| 3,417,301 A | 12/1968 | Galli et al. |
| 3,493,430 A * | 2/1970 | Manasevit .............. H01L 21/00 428/471 |

(Continued)

FOREIGN PATENT DOCUMENTS

| | | | | |
|---|---|---|---|---|
| GB | 1319560 | * | 6/1973 | ......... H01L 21/0242 |
| JP | 59-035098 | | 2/1984 | |
| JP | 2006-270554 | | 10/2006 | |

OTHER PUBLICATIONS

R.K. Gupta et al., "Epitaxial growth of MgFe2O4 (111) thin films on sapphire (0001) substrate", Materials Letters 65(2011) 3058-3060, Jun. 29, 2011.
(Continued)

*Primary Examiner* — Jonathan C Langman
(74) *Attorney, Agent, or Firm* — McDermott Will & Emery LLP

(57) ABSTRACT

The present invention provides a thin film structural body comprising a sapphire substrate having a principal plane of a {11-26} plane and a first epitaxial thin film which is grown directly on the principal plane of the sapphire substrate and has a principal plane of a {100} plane. As one example, in a fabrication method of the thin film structural body, a first epitaxial thin film is grown on a principal plane of a {11-26} plane of the sapphire substrate. The grown first epitaxial thin film has a principal plane of a {100} plane.

12 Claims, 14 Drawing Sheets

(51) Int. Cl.
  *H01L 41/27* (2013.01)
  *H01L 41/319* (2013.01)
  *C30B 29/20* (2006.01)
  *C30B 23/02* (2006.01)
  *C30B 29/32* (2006.01)
  *C30B 29/26* (2006.01)
  *C30B 29/16* (2006.01)
  *H01L 41/313* (2013.01)
  *H01L 41/316* (2013.01)
  *H01F 41/18* (2006.01)
  *H01L 41/187* (2006.01)

(52) U.S. Cl.
  CPC .............. *C30B 29/26* (2013.01); *C30B 29/32* (2013.01); *H01L 41/27* (2013.01); *H01L 41/312* (2013.01); *H01L 41/313* (2013.01); *H01L 41/319* (2013.01); *H01F 41/18* (2013.01); *H01L 41/187* (2013.01); *H01L 41/316* (2013.01)

(58) Field of Classification Search
  CPC ..... C30B 25/02; H01L 41/313; H01L 41/312; H01L 41/27; H01L 41/319; H01L 41/187; H01L 41/316; H01L 41/083; H01L 41/18; H01L 41/314; H01F 41/18
  See application file for complete search history.

(56) References Cited

U.S. PATENT DOCUMENTS

| | | | | |
|---|---|---|---|---|
| 4,066,481 A | * | 1/1978 | Manasevit | C30B 25/02 117/90 |
| 4,368,098 A | * | 1/1983 | Manasevit | C30B 25/02 117/101 |
| 4,404,265 A | * | 9/1983 | Manasevit | H01L 21/0242 117/104 |
| 8,536,030 B2 | | 9/2013 | Wunderer et al. | |
| 2006/0216549 A1 | | 9/2006 | Kijima et al. | |
| 2011/0227198 A1 | * | 9/2011 | Wunderer | C30B 23/025 257/615 |

OTHER PUBLICATIONS

M.C. Martinez Tomas et al., "X-ray and transmission electron microscopy characterization of twinned CdO thin films grown on a-plane sapphire by metalorganic vapour phase epitaxy", Applied Physics A Materials Science & Processing, 88, 61-64(2007) (DOI: 10.1007/s00339-007-3977-x), Apr. 18, 2007.

* cited by examiner

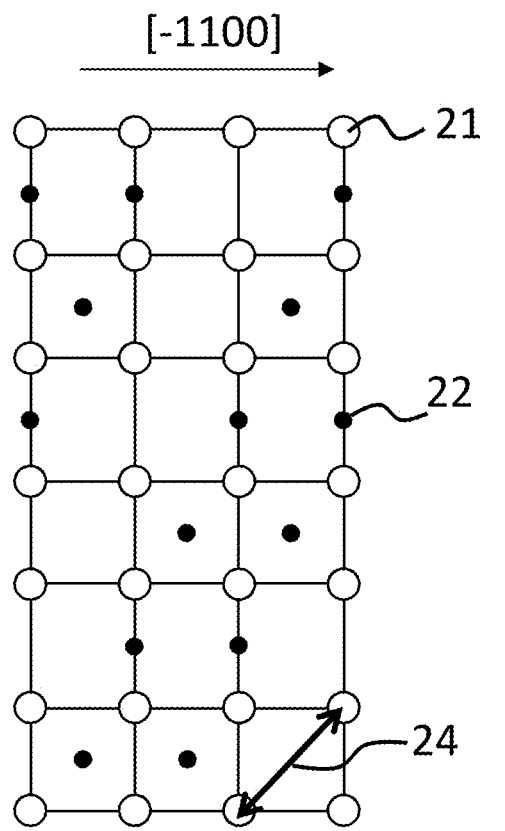 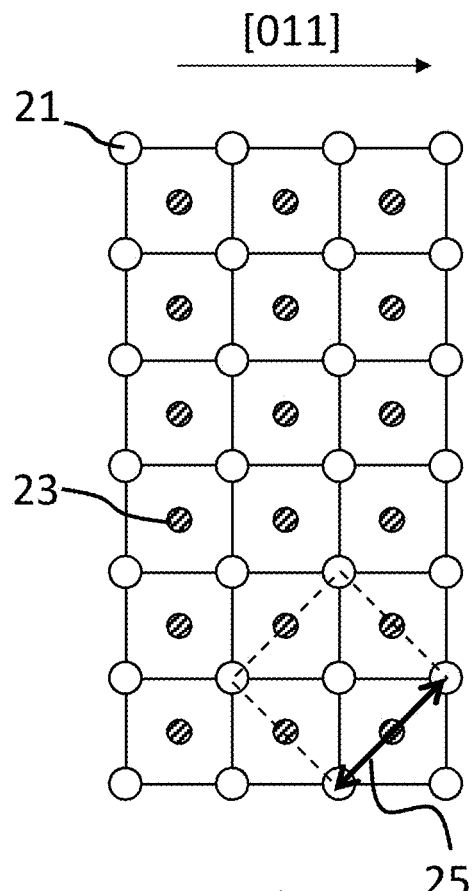
Sapphire (11-26) plane
FIG. 2A
NiO (100) plane
FIG. 2B

THIN-FILM STRUCTURAL BODY AND METHOD FOR FABRICATING THEREOF

BACKGROUND

1. Technical Field

The present invention relates to a thin-film structural body and a method for fabricating thereof.

2. Description of the Related Art

Sapphire (i.e., $\alpha$-$Al_2O_3$) has outstanding chemical and mechanical stability, high thermal conductivity, high translucency, and low dielectric loss property. So, sapphire is suitable for a material of a substrate of an electronic device or an optical device. To provide the electronic device or the optical device, as disclosed in the following literatures, an epitaxial oxide thin film is grown on a sapphire substrate.

Adachi et al disclose a method for forming, on a c-plane sapphire, a ferroelectric thin film composed of an oxide containing lead, titanium, and lanthanum and having a principal plane of a (111) plane in Patent Literature 1.

Kijima et al. disclose a niobic acid titanic acid zirconic acid lead laminate including a sapphire substrate and a niobic acid titanic acid zirconic acid lead film which is formed on the sapphire substrate in Patent Literature 2.

R. K. Gupta et al. disclose a method for growing an epitaxial oxide thin film formed of $MgFe_2O_4$ on a sapphire substrate having a (0001) principal plane in Non-patent Literature 1.

M. C. Martines Tomas et al. disclose a method for growing an epitaxial oxide thin film formed of CdO on an $\alpha$-plane sapphire substrate in Non-patent Literature 2.

CITATION LIST

Patent Literature

Patent Literature 1: Japanese laid-open patent publication No. S59-035098A

Patent Literature 2: United States Patent Application Publication No. 2006/0216549.

Non-Patent Literature

Non-patent Literature 1: R. K. Gupta et al., "Epitaxial growth of $MgFe_2O_4$ (111) thin films on sapphire (0001) substrate", Materials Letters 65 (2011) 3058-3060

Non-patent Literature 2: M. C. Martines Tomas et al., "X-ray and transmission electron microscopy characterization of twinned CdO thin films grown on a-plane sapphire by metalorganic vapour phase epitaxy", Applied Physics A Materials Science & Processing, 88, 61-64 (2007) (DOI: 10.1007/s00339-007-3977-x)

SUMMARY

The present invention provides a thin film structural body comprising:

a sapphire substrate having a principal plane of a {11-26} plane; and a first epitaxial thin film which is grown directly on the principal plane of the sapphire substrate, wherein the first epitaxial thin film is formed of an oxide; and the first epitaxial thin film has a principal plane of a {100} plane.

The present invention also provides a method for fabricating a thin film structural body, the method comprising:

(a) growing a first epitaxial thin film on a principal plane of a first substrate which is a sapphire substrate, wherein the principal plane of the sapphire substrate is a {11-26} plane;

the first epitaxial thin film is formed of an oxide; and the first epitaxial oxide film has a principal plane of a {100} plane.

The present invention provides a method for growing an epitaxial oxide thin film having a principal plane of a {100} plane directly on a sapphire substrate. In other words, the present invention provides a thin film structural body comprising a sapphire substrate and an epitaxial oxide thin film which is grown directly on the sapphire substrate and has a principal plane of a {100} plane.

BRIEF DESCRIPTION OF THE DRAWINGS

FIG. 2A shows a schematic view of atomic arrangement on a sapphire (11-26) plane.

FIG. 2B shows a schematic view of atomic arrangement on a (100) plane of a nickel oxide (i.e., NiO) crystal having a typical rock salt crystalline structure.

DETAIL DESCRIPTION OF THE EMBODIMENT

Definition of the Terms and Recitation

The term "directly" used in the instant specification means "physical contact". In other words, the term "directly" means that an intermediate layer such as a buffer layer is not interposed. For example, the recitation "A first epitaxial thin film is grown directly on a sapphire substrate" means "The first epitaxial thin film is in physical contact with the sapphire substrate, and the intermediate layer such as a buffer layer is not interposed between the first epitaxial thin film and the sapphire substrate".

The term "epitaxial oxide thin film" used in the instant specification means "an epitaxial thin film formed of an oxide".

The recitation "{11-26} plane" used in the instant specification includes not only a (11-26) plane but also planes equivalent to the (11-26) plane. An example of the planes equivalent to the (11-26) plane is a (1-216) plane or a (-2116) plane. Likewise, the recitation "{100} plane" includes not only a (100) plane but also planes equivalent to the (100) plane. An example of the planes equivalent to the (100) plane is a (010) plane or (001) plane.

The recitation "<1-100> axis" used in the instant specification includes not only a [1-100] axis but also axes equivalent to the [1-100] axis. An example of the axes equivalent to the [1-100] axis is a [-1100] axis, a [-1010] axis, a [10-10] axis, a [01-10] axis, or a [0-110] axis.

The recitation "<100> axis" includes not only a [100] axis but also axes equivalent to the [100] axis. An example of the axes equivalent to the [100] axis is a [010] axis or a [001] axis.

The recitation "<110> axis" includes not only a [110] axis but also axes equivalent to the [110] axis. An example of the axes equivalent to the [110] axis is a [011] axis, a [101] axis, or [-110] axis.

Technical Problem and the Finding by the Present Inventors

In a conventional method for growing an epitaxial oxide thin film directly on a sapphire substrate, the epitaxial oxide thin film has a principal plane of not a {100} plane but a {110} or {111} plane. The present inventors found that an epitaxial oxide thin film grown directly on a sapphire substrate having a principal plane of a {11-26} plane has a principal plane of a {100} plane. The present invention is achieved on the basis of this finding.

An object of the present invention is to provide a method for growing an epitaxial oxide thin film having a principal plane of a {100} plane directly on a sapphire substrate. In other words, an object of the present invention is to provide a thin film structural body comprising a sapphire substrate and an epitaxial oxide thin film which is grown directly on the sapphire substrate and has a principal plane of a {100} plane.

Hereinafter, a thin film structural body and a fabrication method thereof according to the present embodiment will be described with reference to the drawings.

First Embodiment

Figure 1A:
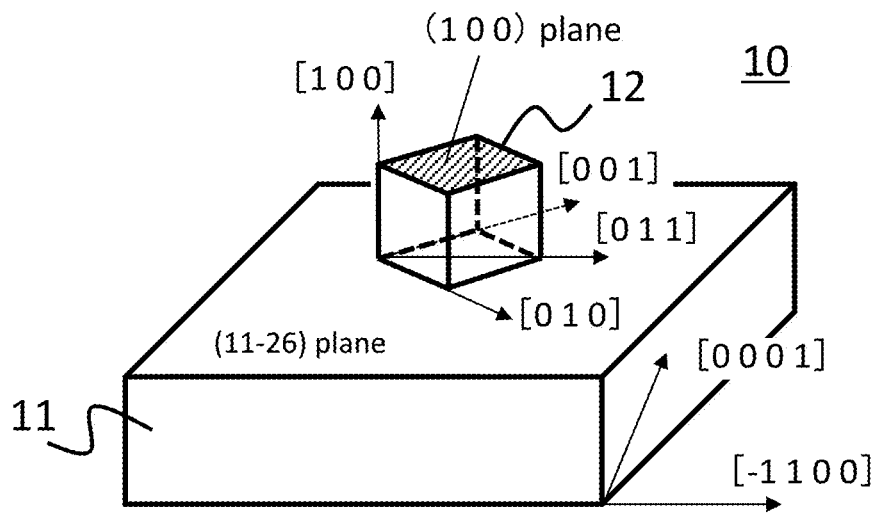
FIG. 1A shows a schematic view of a thin film structural body according to an embodiment.
Figure 1B:
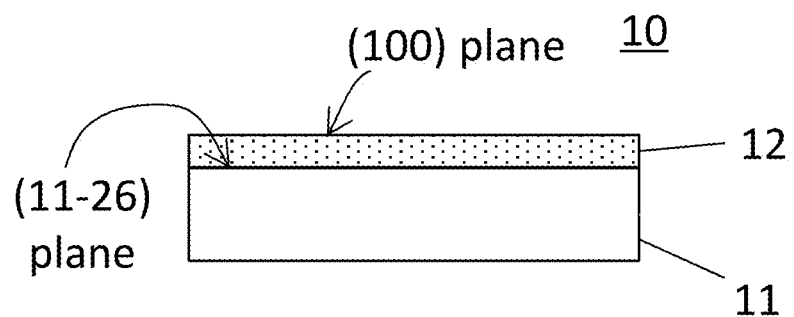
FIG. 1B shows a cross-sectional view of the thin film structural body according to the embodiment.

FIG. 1A shows a schematic view of a thin film structural body 10 according to the embodiment. FIG. 1B shows a cross-sectional view of the thin film structural body 10 according to the embodiment. As shown in FIG. 1A and FIG. 1B, the thin film structural body 10 according to the embodiment comprises a sapphire substrate 11 and a first epitaxial thin film 12. The first epitaxial thin film 12 is grown directly on a (11-26) plane of the sapphire substrate 11. The first epitaxial thin film 12 is formed of an oxide. The first epitaxial thin film 12 has a principal plane of a (100) plane. A [-1100] axis of the sapphire substrate 11 is parallel to a [011] axis of the first epitaxial thin film 12.

As described above, the thin film structural body 10 according to the embodiment comprises the sapphire substrate 11 having a principal plane of a {11-26} plane and the first epitaxial thin film 12 which is grown directly on the principal plane of the sapphire substrate 11, is formed of an oxide, and has a principal plane of a {100} plane. The {100} plane of the first epitaxial thin film 12 is parallel to the principal plane of the sapphire substrate 11. It is desirable that the sapphire substrate 11 is monocrystalline.

In the instant specification, the principal plane of the {11-26} plane may be referred to just as a {11-26} principal plane. Likewise, the principal plane of the {100} plane may be referred to just as a {100} principal plane. Needless to say, since an epitaxial thin film is monocrystalline, the first epitaxial thin film 12 is also monocrystalline.

It is desirable that the first epitaxial thin film 12 formed of an oxide has a cubical crystalline structure. The cubical crystalline structure of the first epitaxial thin film 12 may strain slightly. For this reason, the first epitaxial thin film 12 may have a tetragonal crystalline structure or an orthorhombic crystalline structure in place of the cubical crystalline structure. The first epitaxial thin film 12 may be formed of a monocrystalline material having a rock salt crystalline structure, a spinel crystalline structure, or a perovskite crystalline structure.

FIG. 2A shows a schematic view of atomic arrangement on the sapphire (11-26) plane. FIG. 2B shows a schematic view of atomic arrangement on a (100) plane of a nickel oxide (i.e., NiO) crystal having a typical rock salt crystalline structure. In both FIG. 2A and FIG. 2B, the direction of the [−1100] axis of the sapphire accords with the direction of the [011] axis of the nickel oxide. As shown in FIG. 2A, the sapphire (11-26) plane includes oxygen cell lattices in each of which oxygen atoms 21 are arranged at the vertexes and aluminum atoms 22. On the other hand, as shown in FIG. 2B, the nickel oxide (100) plane includes oxygen cell lattices in each of which oxygen atoms 21 are arranged at the vertexes and nickel atoms 23 each disposed at the center of the oxygen cell lattice. The crystal system of sapphire (i.e., hexagonal system) is different from the crystal system of nickel oxide (i.e., cubic system). However, as is clear from FIG. 2A and FIG. 2B, the oxygen cell lattice of the sapphire (11-26) plane is similar to the oxygen cell lattice of the nickel oxide (100) plane.

The rock salt crystalline structure of the nickel oxide crystal has a unit lattice length 25 of 0.417 nanometers. On the other hand, a mean average of an interoxygen distance 24 (i.e., length of a diagonal line of the oxygen cell lattice) of the sapphire (11-26) plane is approximately not less than 0.39 nanometers and not more than 0.43 nanometers. Note that all of the oxygen atoms are not disposed at regular intervals in the hexagonal crystalline structure of the sapphire. The mean average (i.e., approximately not less than 0.39 nanometers and not more than 0.43 nanometers) is roughly matched to the unit lattice length 25 (i.e., 0.417 nanometers) of the rock salt crystalline structure of the nickel oxide crystal. Therefore, the sapphire (11-26) plane is suitable for epitaxially growing the nickel oxide thin film having a principal plane of a (100) plane.

It is desirable that a lattice mismatch ratio of the (100) plane of the first epitaxial thin film 12 to the sapphire (11-26) plane is not more than 10%. For the lattice mismatch ratio of not more than 10%, it is desirable that the following mathematical formula is satisfied.

$$0.35n \text{ nanometers} \leq a \leq 0.47n \text{ nanometers} \quad (I)$$

where a represents a lattice constant of the first epitaxial thin film 12, and n represents a natural number.

When the mathematical formula (I) is satisfied, the sapphire (11-26) plane is suitable for epitaxially growing the first epitaxial thin film 12 having a (100) principal plane. Desirably, the value of n is 1.

<Sapphire Substrate>

Figure 3:
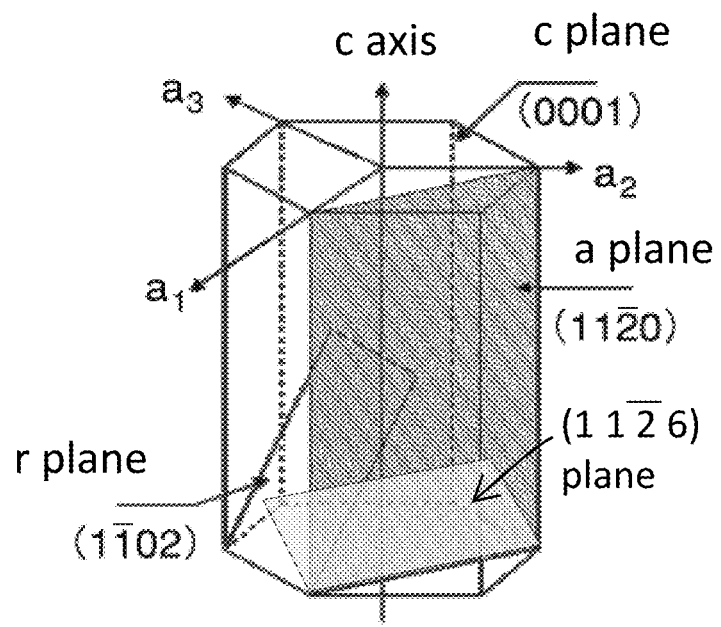
FIG. 3 shows a schematic view of a unit cell of a monocrystalline sapphire.

FIG. 3 shows a schematic view of a unit cell of a monocrystalline sapphire. The {11-26} principal plane of the sapphire substrate 11 may have an off angle of less than approximately 10 degrees. This means that a direction cosine of a physical property of a <100> main axis of the first epitaxial thin film 12 grown directly on the {11-26} plane of the sapphire substrate 11 falls within a range of less than 2 degrees. In particular, it is desirable that the off angle is less than 5 degrees to cause the direction cosine to fall within the range of less than 0.4 degrees. The {11-26} plane of the sapphire substrate 11 may be provided by cutting a monocrystalline sapphire by an ordinary method. The {11-26} plane forms angles of approximately 42 degrees and 48 degrees with respect to a c-plane (i.e., {0001} plane) and an a-plane (i.e., {11-20} plane), respectively.

<First Epitaxial Thin Film 12>

In the present invention, the first epitaxial thin film 12 is formed of an oxide.

When the first epitaxial thin film 12 having a {100} principal plane is used as a piezoelectric thin film, a polarization axis of a [001] axis is oriented perpendicularly to the {100} principal plane. For this reason, an electrical energy and a mechanical energy are converted efficiently into each other due to piezoelectric effect. As a result, the performance of an actuator or a piezoelectric generation element is improved. A sound speed of a surface acoustic wave of the sapphire substrate 11 is approximately two times as much as that of an ordinary piezoelectric crystal. For this reason, the thin film structural body 10 comprising the monocrystalline sapphire substrate 11 and the first epitaxial thin film 12 having a {100} plane parallel to the principal plane of the monocrystalline sapphire substrate 11 allows higher frequency of a surface acoustic wave device.

Furthermore, when the first epitaxial thin film 12 comprises a magnetic property, a magnetization direction tends to be perpendicular to the {100} plane due to growth of the first epitaxial thin film 12 having a {100} principal plane. As a result, the growth improves the performance of a magnetic device. In addition, when the first epitaxial thin film 12 has antiferromagnetism, the main axis of the first epitaxial thin film 12 is oriented so as to cancel spin orientation mutually in the inside of the first epitaxial thin film 12. For this reason, the magnetization of two magnetic films grown adjacently (i.e., two first epitaxial thin films 12) is immobilized efficiently.

Besides, when the first epitaxial thin film 12 has electron conductivity or ionic conductivity, since the <100> axis is oriented perpendicular to the {100} principal plane, electrons, holes, or ions migrate smoothly in the thickness direction of the first epitaxial thin film 12. For this reason, the first epitaxial thin film 12 is used as an electron/hole transport layer or a solid electrolyte of an ion control element or a secondary battery to improve performance of a device.

When the first epitaxial thin film 12 is formed of a material having a rock salt crystalline structure, a spinel crystalline structure, or a perovskite crystalline structure, the first epitaxial thin film 12 can have a function of ferroelectricity, piezoelectricity, pyroelectricity, electrooptic property, electron conductivity, ion conductivity, superconductivity or magnetism. For this reason, the first epitaxial thin film 12 can be employed for a high-performance thin film electronic device. Since the first epitaxial thin film 12 is formed of an oxide, the first epitaxial thin film 12 can be used stably in an ordinary atmosphere.

An example of the material having a rock salt crystalline structure is nickel oxide (i.e., NiO) or iron oxide such as Wüstite (i.e., FeO). A part of a component of the nickel oxide or the iron oxide may be substituted with another element. Another example of the material having a rock salt crystalline structure is lithium cobaltite (i.e., $LiCoO_2$).

An example of the material having a spinel crystalline structure is cobalt oxide (i.e., $Co_3O_4$) or iron oxide such as magnetite (i.e., $Fe_3O_4$) or maghemite (i.e., $\gamma\text{-}Fe_2O_3$). A part of a component of the cobalt oxide or the iron oxide may be substituted with another element.

A material having a perovskite crystalline structure is represented by the chemical formula $ABO_3$ (where A represents alkali metal, alkali earth metal, lanthanoids, Pb, or Bi, and B represents transition metal such as Ti, Nb, Mn, Ni, V, Co, Zr, Nb, Ta, or Ru). The material having a perovskite crystalline structure can be used effectively as the first epitaxial thin film 12 having the above function.

Since the first epitaxial thin film 12 having a {100} principal plane is grown directly on the sapphire substrate 11 having a {11-26} principal plane, a high-performance device having characteristics of sapphire of chemical and mechanical stability, low dielectric loss, and high thermal conductivity is achieved. A sapphire wafer having a diameter of six inches is commercially available. Such a sapphire substrate is desirable in light of industrial production.

<Second Epitaxial Thin Film 13>

The first epitaxial thin film 12 may be used as a lattice buffer layer. In other words, a second epitaxial thin film 13 may be grown above the sapphire substrate 11 in such a manner that the lattice buffer layer (i.e., the first epitaxial thin film 12) is interposed between the sapphire substrate 11 and the second epitaxial thin film 13. Unlike the first epitaxial thin film 12, note that the second epitaxial thin film 13 is not grown directly on the sapphire substrate 11. The second epitaxial thin film 13 formed of a metal crystal having a face-centered cubic lattice structure may be grown on the first epitaxial thin film 12 having a {100} principal plane. An example of the crystalline structure of the second epitaxial thin film 13 is a cubical crystalline system, a tetragonal system or an orthorhombic system. The crystalline structure of the second epitaxial thin film 13 is not limited, as long as the second epitaxial thin film 13 is grown on the first epitaxial thin film 12. Unlike the first epitaxial thin film 12, the second epitaxial thin film 13 need not be an oxide.

<Fabrication Method of Thin Film Structural Body 10>

Figure 4A:
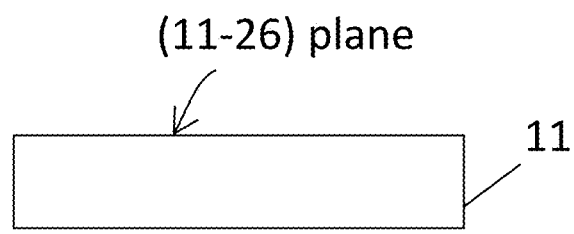
FIG. 4A shows a cross-sectional view of one step included in a fabrication method of the thin film structural body.
Figure 4B:
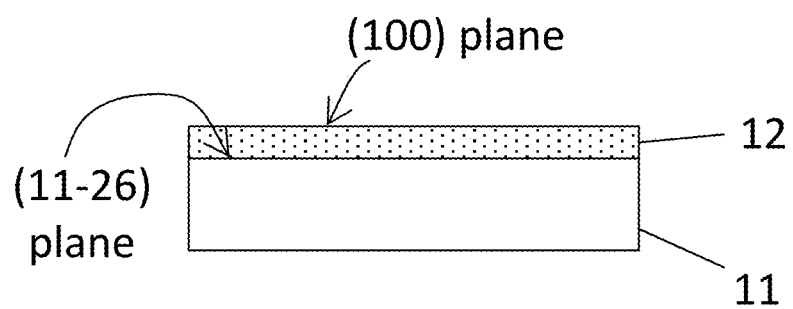
FIG. 4B shows a cross-sectional view of a step of the fabrication method which is subsequent to the step shown in FIG. 4A.
Figure 4C:
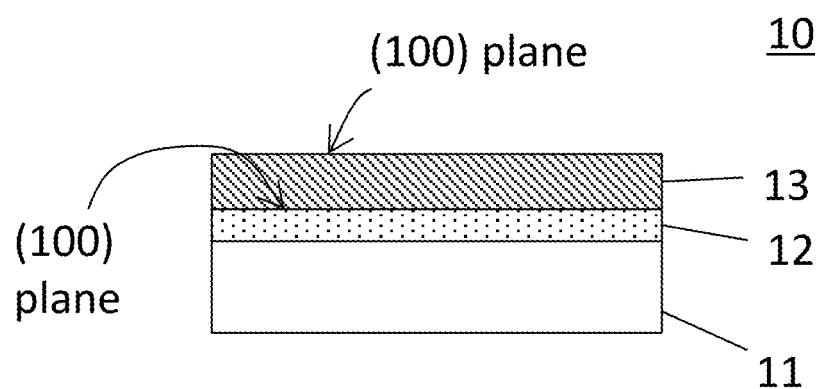
FIG. 4C shows a cross-sectional view of a step of the fabrication method which is subsequent to the step shown in FIG. 4B.

FIG. 4A shows a cross-sectional view of a step of a fabrication method of the thin film structural body 10. FIG. 4B shows a cross-sectional view of a step of the fabrication method which is subsequent to the step shown in FIG. 4A. FIG. 4C shows a cross-sectional view of a step of the fabrication method which is subsequent to the step shown in FIG. 4B.

(I) First, as shown in FIG. 4A, a sapphire substrate 11 having a principal plane of a (11-26) plane is prepared.

(II) Then, as shown in FIG. 4B, a first epitaxial thin film 12 having a principal plane of a (100) plane is grown directly on the (11-26) principal plane of the sapphire substrate 11. For example, when the first epitaxial thin film 12 is formed of NiO, the first epitaxial thin film 12 may be grown by a sputtering method. The growth method of the first epitaxial thin film 12 is not limited to the sputtering method. Another method such as a laser ablation method or a chemical vapor deposition method may be used for the growth of the first epitaxial thin film 12.

(III) Furthermore, as shown in FIG. 4C, a second epitaxial thin film 13 having a (100) principal plane is grown on the (100) principal plane of the first epitaxial thin film 12. For example, the second epitaxial thin film 13 formed of platinum may be grown by a sputtering method. The growth method of the second epitaxial thin film 13 is not limited to the sputtering method. Another method such as a laser ablation method or a chemical vapor deposition method may be used for the growth of the second epitaxial thin film 13.

In this way, provided is a thin film structural body 10 in which the second epitaxial thin film 13 is grown above the sapphire substrate 11 in such a manner that the first epitaxial thin film 12 serving as the lattice buffer layer is interposed between the sapphire substrate 11 and the second epitaxial thin film 13.

<Fabrication Method of Layered Product 60>

Ultraviolet passes through sapphire. This characteristic of sapphire is used in the fabrication method of a layered product 60.

Figure 5A:
FIG. 5A shows a cross-sectional view of one step included in a fabrication method of a layered product.
Figure 5B:
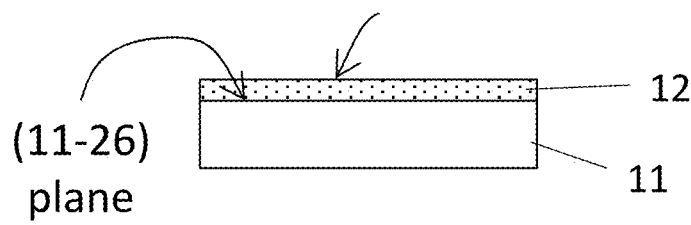
FIG. 5B shows a cross-sectional view of a step of the fabrication method which is subsequent to the step shown in FIG. 5A.
Figure 5C:
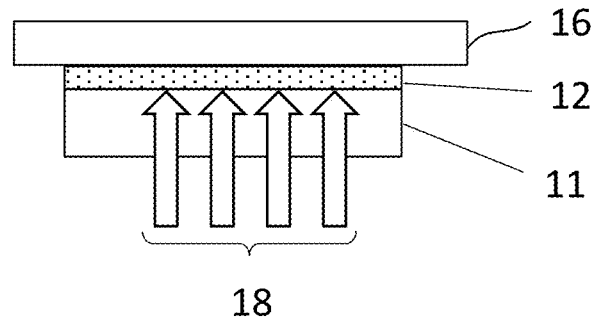
FIG. 5C shows a cross-sectional view of a step of the fabrication method which is subsequent to the step shown in FIG. 5B.
Figure 5D:
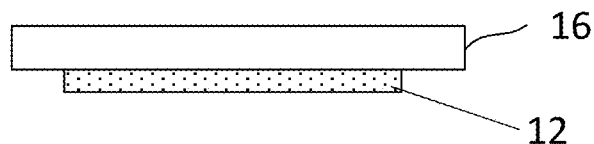
FIG. 5D shows a cross-sectional view of a step of the fabrication method which is subsequent to the step shown in FIG. 5C.

FIG. 5A shows a cross-sectional view of one step included in a fabrication method of the layered product 60. FIG. 5B-FIG. 5D show cross-sectional views of steps of the fabrication method which are subsequent to the steps shown in FIG. 5A-FIG. 5C, respectively.

(I) First, as shown in FIG. 5A, a sapphire substrate 11 having a principal plane of a (11-26) plane is prepared.

(II) Then, as shown in FIG. 5B, a first epitaxial thin film 12 having a principal plane of a (100) plane is grown on the (11-26) principal plane of the sapphire substrate 11. For example, when the first epitaxial thin film 12 is formed of NiO, the first epitaxial thin film 12 may be grown by a sputtering method. The growth method of the first epitaxial thin film 12 is not limited to the sputtering method. Another method such as a laser ablation method or a chemical vapor deposition method may be used for the growth of the first epitaxial thin film 12.

(III) Furthermore, as shown in FIG. 5C, a front surface of the first epitaxial thin film 12 is brought into contact with a second substrate 16. While the front surface of the first epitaxial thin film 12 is in contact with the second substrate 16, a back surface of the sapphire substrate 11 is irradiated with laser light 18. The laser light 18 passes through the sapphire substrate 11 to reach the back surface of the first epitaxial thin film 12, and thereby the first epitaxial thin film 12 is separated from the sapphire substrate 11. In this way, as shown in FIG. 5D, provided is the layered product 60 in which the first epitaxial thin film 12 has been transferred onto the second substrate 16. Before the front surface of the first epitaxial thin film 12 is brought into contact with the second substrate 16, it is desirable that gold-plated layers are formed on the front surface of the first epitaxial thin film 12 and on the back surface of the second substrate 16. Au—Au bonds are formed by joining the two gold-plated layers, which allows the first epitaxial thin film 12 and the second substrate 16 to be joined firmly with each other.

An example of the laser light 18 is an ultraviolet KrF excimer laser having a wavelength of 248 nanometers, a XeCl excimer laser having a wavelength of 308 nanometers, a third-order harmonics $Nd:YVO_4$ laser having a wavelength of 355 nanometers, or a third-order harmonics Nd:YAG laser. In the second method, the sapphire substrate 11 can be used repeatedly.

<Fabrication Method of Layered Product 70>

Figure 6A:
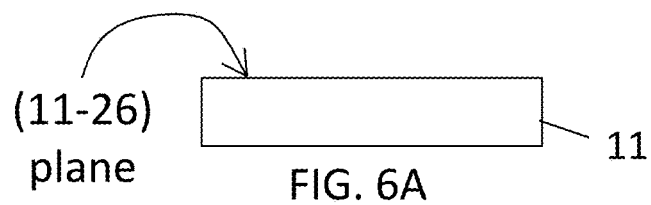
FIG. 6A shows a cross-sectional view of one step included in a fabrication method of a layered product.

FIG. 6A shows a cross-sectional view of one step included in a fabrication method of a layered product 70. FIG. 6B-FIG. 6E show cross-sectional views of steps of the fabrication method which are subsequent to the steps shown in FIG. 6A-FIG. 6D, respectively.

(I) First, as shown in FIG. 6A, a sapphire substrate 11 having a principal plane of a (11-26) plane is prepared.

Figure 6B:
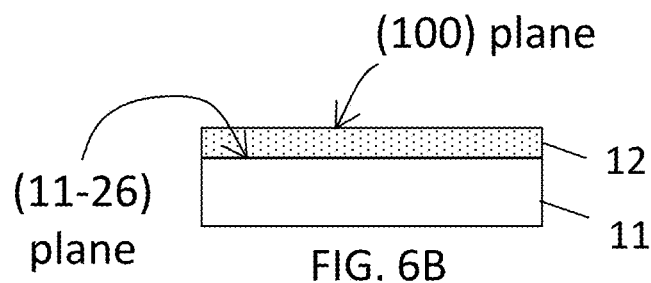
FIG. 6B shows a cross-sectional view of a step of the fabrication method which is subsequent to the step shown in FIG. 6A.

(II) Then, as shown in FIG. 6B, a first epitaxial thin film 12 having a principal plane of a (100) plane is grown on the (11-26) principal plane of the sapphire substrate 11. For example, when the first epitaxial thin film 12 is formed of NiO, the first epitaxial thin film 12 may be grown by a sputtering method. The growth method of the first epitaxial thin film 12 is not limited to the sputtering method. Another method such as a laser ablation method or a chemical vapor deposition method may be used for the growth of the first epitaxial thin film 12.

Figure 6C:
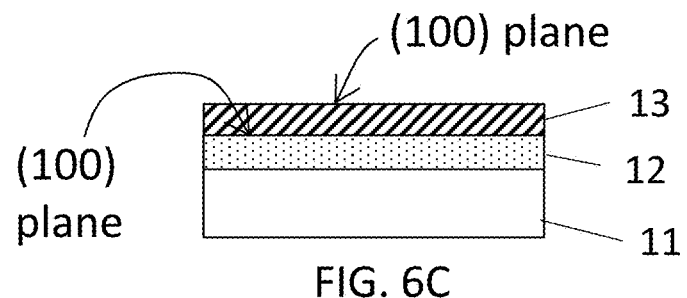
FIG. 6C shows a cross-sectional view of a step of the fabrication method which is subsequent to the step shown in FIG. 6B.

(III) Furthermore, as shown in FIG. 6C, a second epitaxial thin film 13 having a (100) principal plane is grown on the (100) principal plane of the first epitaxial thin film 12. For example, the second epitaxial thin film 13 formed of platinum may be grown by a sputtering method. The growth method of the second epitaxial thin film 13 is not limited to the sputtering method. Another method such as a laser ablation method or a chemical vapor deposition method may be used for the growth of the second epitaxial thin film 13.

Figure 6D:
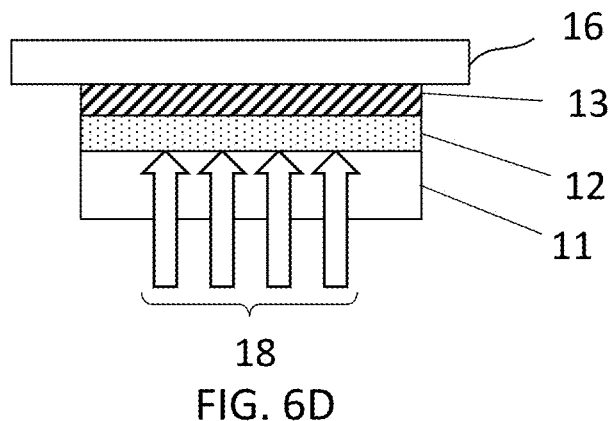
FIG. 6D shows a cross-sectional view of a step of the fabrication method which is subsequent to the step shown in FIG. 6C.
Figure 6E:
FIG. 6E shows a cross-sectional view of a step of the fabrication method which is subsequent to the step shown in FIG. 6D.

(IV) Furthermore, as shown in FIG. 6D, a front surface of the second epitaxial oxide 13 is brought into contact with a second substrate 16. While the front surface of the second epitaxial oxide film 13 is in contact with the second substrate 16, the back surface of the sapphire substrate 11 is irradiated with laser light 18. The laser light 18 passes through the sapphire substrate 11 to reach the back surface of the first epitaxial thin film 12, and thereby the sapphire substrate 11 is separated from the back surface of the first epitaxial thin film 12. In this way, the sapphire substrate 11 is removed. Furthermore, the laser light 18 is irradiated with the back surface of the first epitaxial thin film 12 to remove the first epitaxial thin film 12 by a laser polishing method. In this way, as shown in FIG. 6E, provided is the layered product 70 in which the second epitaxial thin film 13 has been transferred onto the second substrate 16.

As described above, in the present fabrication method, the first epitaxial thin film 12 capable of absorbing laser light is grown as the lattice buffer layer directly on the {11-26} principal plane of the sapphire substrate 11, and then, the second epitaxial thin film 13 is grown on the lattice buffer layer. The second epitaxial thin film 13 having significantly small damage is transferred onto the second substrate 16. It is desirable that the first epitaxial thin film 12 serving as the lattice buffer layer is formed of an oxide containing nickel or iron. This is because the oxide containing nickel or iron absorbs laser light easily, and as a result, the sapphire substrate 11 is easily separated (namely, removed). In more detail, the oxide containing nickel or iron is easily reduced by the irradiation with the laser light to generate an oxygen gas, which promotes the separation (i.e., the removal) of the sapphire substrate 11, the inventors believe.

When the second substrate 16 is a wafer comprising a silicon element on the surface thereof, the first epitaxial thin film 12 is combined with the silicon element to provide a high-performance sensor or signal processor.

The first epitaxial thin film 12 or the second epitaxial thin film 13 is transferred to a flexible film to provide a device for converting mechanical vibration to an electric signal. Since the formation temperature of the piezoelectric thin film is required to be not less than 600 degrees Celsius, it is difficult to form the piezoelectric thin film directly onto the flexible film. However, the first epitaxial thin film 12 (or the second epitaxial thin film 13) having a polarization and a principal plane of a (001) plane is formed on the flexible film by the above two methods in which the transfer is employed to provide a flexible sensor or a vibration electric-generation device for converting stress into an electric voltage.

The first epitaxial thin film 12 (or the second epitaxial thin film 13) having a principal plane of a (001) plane is transferred to a thin rectangular stainless plate to provide an actuator in which the stainless plate is bent in a thickness direction thereof during the application of voltage. Since the polarization axis (i.e., the [001] axis) of the first epitaxial thin film 12 (or the second epitaxial thin film 13) is perpendicular to the principal plane of the first epitaxial thin film 12 (or the second epitaxial thin film 13), the deformation amount of the actuator with regard to the applied voltage is maximized.

The first epitaxial thin film 12 (or the second epitaxial thin film 13) is multi-stacked by repeatedly transferring the first epitaxial thin film 12 (or the second epitaxial thin film 13). For example, the first epitaxial thin film 12 (or the second epitaxial thin film 13) is transferred repeatedly to provide a multi-stacked piezoelectric thin film on an epitaxial electrode. Such a multi-stacked piezoelectric thin film deforms largely. For example, the first epitaxial thin film 12 (or the second epitaxial thin film 13) is transferred repeatedly to an electrode to provide a multi-stacked ion conductive film. Such a multi-stacked ion conductive film can be used for a secondary battery or a capacitor having a large capacitance.

EXAMPLES

Hereinafter, the present invention will be described with reference to the following examples.

Inventive Example 1

A first epitaxial thin film 12 was grown on a sapphire substrate 11 by a high-frequency magnetron sputtering method using a target formed of nickel oxide (i.e., NiO). Nickel oxide crystal has a rock salt crystalline structure of cubic system. The value a of the lattice constant of the nickel oxide crystal is 0.418 nanometers. The sapphire substrate 11 was provided by cutting a sapphire monocrystalline substrate (thickness: 0.5 millimeters) so as to have a principal plane of a (11-26) plane. The sapphire substrate 11 was polished, and then, was disposed so as to face the target. A sputter gas was a gaseous mixture of argon (90%) and oxygen (10%). Sputtering discharge of 80 W was excited at a gas pressure of 3 Pa. The first epitaxial thin film 12 was grown on the sapphire substrate 11 heated to 450 degrees Celsius to provide a thin film structural body 10. In the present inventive example 1, "First epitaxial thin film 12" may be referred to as "NiO first epitaxial thin film 12".

Figure 7:
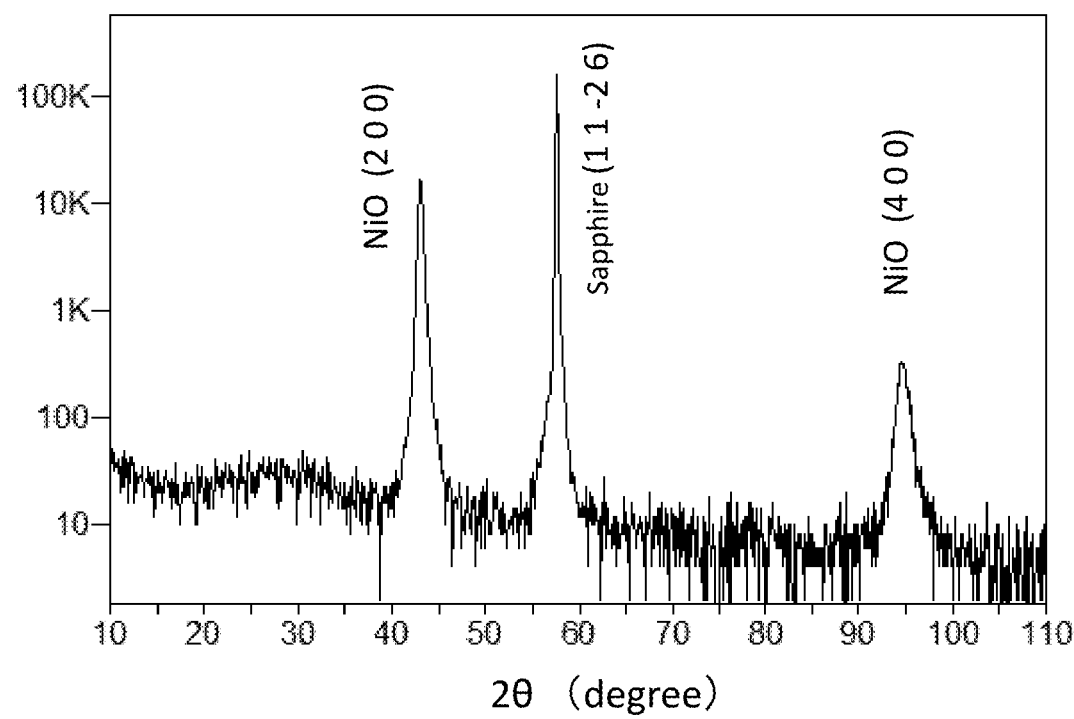
FIG. 7 is an X-ray diffraction graph of the thin film structural body according to an inventive example 1.

FIG. 7 is an X-ray diffraction graph of the thin film structural body 10 according to the inventive example 1. In the X-ray diffraction analysis, a Cu-Kα ray was used. As shown in FIG. 7, only the following three peaks were observed:

(i) a (11-26) peak of the sapphire substrate 11 (2θ=57.6 degrees);

(ii) a (200) peak of the NiO first epitaxial thin film 12 (2θ=43.1 degrees); and (iii) a (400) peak of the NiO first epitaxial thin film 12 (2θ=94.8 degrees).

This means that the NiO first epitaxial thin film 12 having a principal plane of a (100) plane parallel to the (11-26) principal plane of the sapphire substrate 11 was grown.

Figure 8:
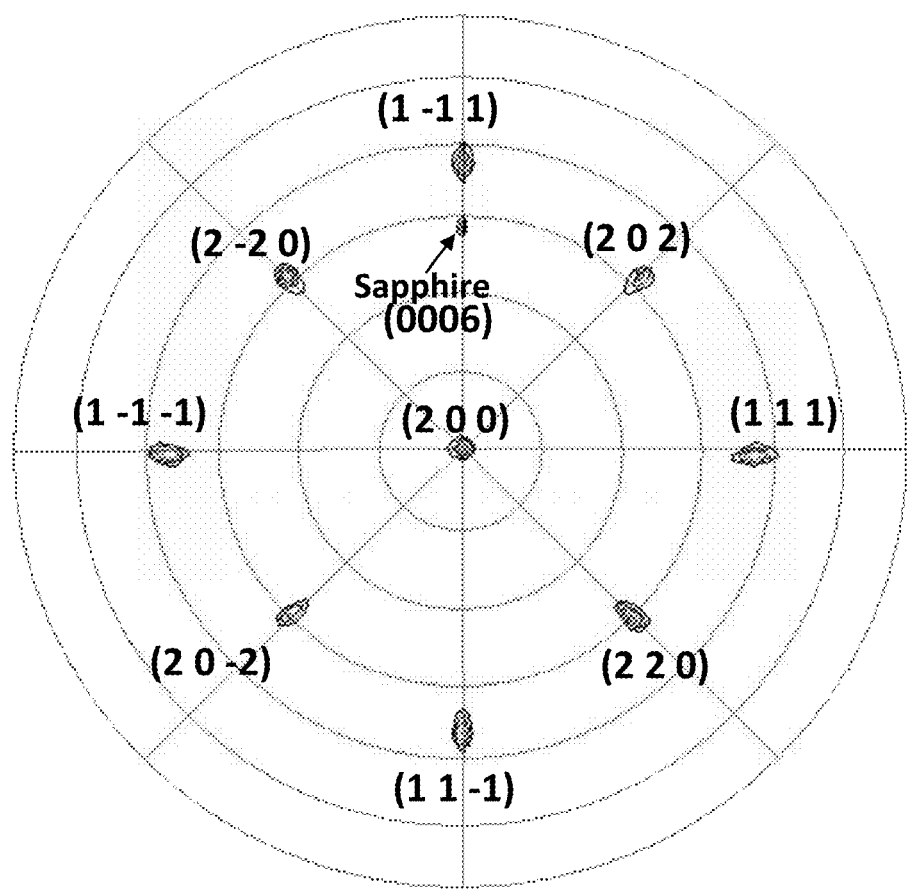
FIG. 8 shows an X-ray pole figure of the thin film structural body according to the inventive example 1.

FIG. 8 shows an X-ray pole figure of the thin film structural body 10 according to the inventive example 1. As shown in FIG. 8, a (200) plane of the NiO first epitaxial thin film 12 was observed in a normal line direction of the (11-26) principal plane of the sapphire substrate 11. Each of {220} planes including a (220) plane, a (202) plane, a (2-20) plane, and a (20-2) plane was positioned so as to be inclined by 45 degrees with regard to the normal line (i.e., the [11-26] direction). These four in-plane rotation angles were observed at an interval of 90 degrees. Each of {111} planes was positioned so as to be inclined by 55 degrees with regard to the normal line (i.e., the [11-26] direction). These four in-plane rotation angles were observed at an interval of 90 degrees, too. An in-plane rotation angle of each of {111} planes formed 45 degrees with each of the {220} planes. The X-ray pole figure shown in FIG. 8 means that the NiO first epitaxial thin film 12 was grown in such a manner that its (100) axis was parallel to the normal line of the (11-26) principal plane of the sapphire substrate. The direction from the pole of the (200) plane of the NiO first epitaxial thin film 12 (i.e., the center point) to the pole of the (0006) plane of the sapphire substrate 11 is parallel to the direction from the center point to the pole of the (1-11) plane of the NiO first epitaxial thin film 12 (each of which is an upper direction on the paper). This means that the [−1100] axis of the sapphire substrate 11 is parallel to the [011] axis of the NiO first epitaxial thin film 12. In this way, the present inventors confirmed that the thin film structural body 10 according to the inventive example 1 has the crystallinity shown in FIG. 1A.

Inventive Example 2

The first epitaxial thin film 12 was grown by a sputtering method on the (11-26) principal plane of the sapphire substrate 11 in a similar way to the inventive example 1, except for the following matters (i)-(iii):
(i) the target was formed of nickel cobaltite (i.e., $NiCo_2O_4$);
(ii) the sputter gas was a gaseous mixture of argon (95%) and oxygen (5%); and
(iii) the sapphire substrate 11 was heated to 400 degrees Celsius.

The nickel cobaltite crystal is formed of a ferri-magnetic oxide of a cubic spinel structure having a lattice constant a of approximately 0.81 nanometers. In the present inventive example 2, "first epitaxial thin film 12" may be referred to as "$NiCo_2O_4$ first epitaxial thin film 12".

Figure 9:
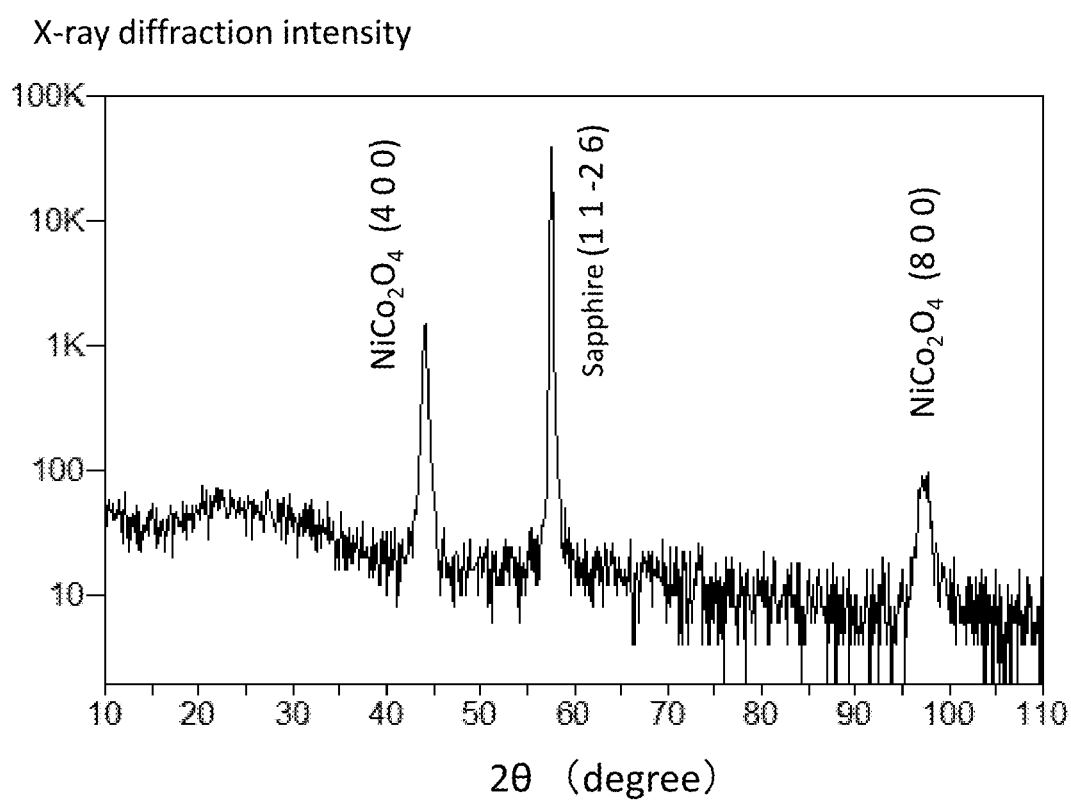
FIG. 9 is an X-ray diffraction graph of the thin film structural body according to an inventive example 2.

FIG. 9 is an X-ray diffraction graph of the thin film structural body 10 according to the inventive example 2. As shown in FIG. 9, only the following three peaks were observed:
(i) a (11-26) peak of the sapphire substrate 11,
(ii) a (400) peak of the $NiCo_2O_4$ first epitaxial thin film 12 (2θ=44.3 degrees), and
(iii) an (800) peak of the $NiCo_2O_4$ first epitaxial thin film 12 (2θ=97.8 degrees).

This means that the $NiCo_2O_4$ first epitaxial thin film 12 having a principal plane of a (100) plane parallel to the (11-26) principal plane of the sapphire substrate 11 was grown. The thin film structural body 10 according to the inventive example 2 can be used as a perpendicular magnetization film included in a magnetic device.

Inventive Example 3

The first epitaxial thin film 12 was grown by a sputtering method on the (11-26) principal plane of the sapphire substrate 11 in a similar way to the inventive example 1, except for the following matters (i)-(iv):
(i) the target was formed of sodium bismuth barium titanate (i.e., $(Na, Bi, Ba)TiO_3$, hereinafter, referred to as "NBT");
(ii) the sputter gas was a gaseous mixture of argon (75%) and oxygen (25%);
(iii) the sapphire substrate 11 was heated to 650 degrees Celsius; and
(iv) the input of the sputtering discharge was 170 W.

An NBT crystal has a tetragonal crystalline structure having lattice constants a and c of 0.388 nanometers and 0.395 nanometers respectively. In the present inventive example 3, "first epitaxial thin film 12" may be referred to as "NBT first epitaxial thin film 12".

Figure 10:
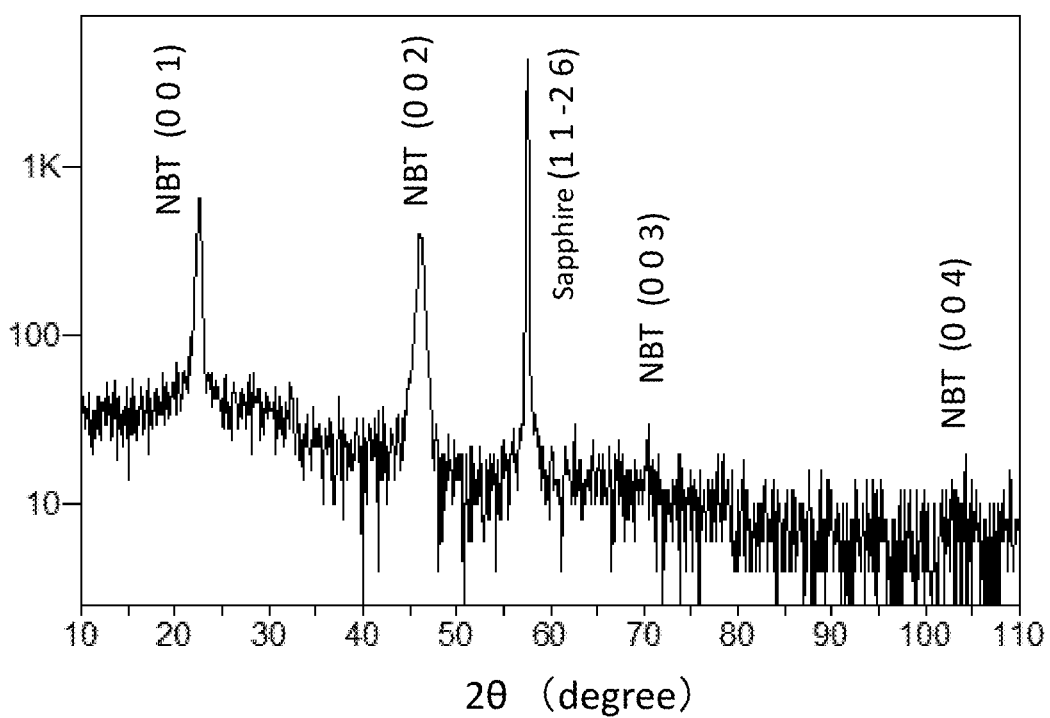
FIG. 10 is an X-ray diffraction graph of the thin film structural body according to an inventive example 3.

FIG. 10 is an X-ray diffraction graph of the thin film structural body 10 according to the inventive example 3. As shown in FIG. 10, only the following five peaks were observed:
(i) a (11-26) peak of the sapphire substrate 11,
(ii) a (001) peak of the NBT first epitaxial thin film 12 (2θ=22.5 degrees),
(iii) a (002) peak of the NBT first epitaxial thin film 12 (2θ=46.0 degrees),
(iv) a (003) peak of the NBT first epitaxial thin film 12 (2θ=71.7 degrees), and
(v) a (004) peak of the NBT first epitaxial thin film 12 (2θ=102.8 degrees).

This means that the NBT first epitaxial thin film 12 having a principal plane of a (001) plane parallel to the (11-26) principal plane of the sapphire substrate 11 was grown. The thin film structural body 10 according to the inventive example 3 can be used as a polarization orientation film included in a surface acoustic wave device.

$Pb(Zr,Ti)O_3$ or $(K,Na)NbO_3$ may be used in place of NBT.

Inventive Example 4

Figure 11A:
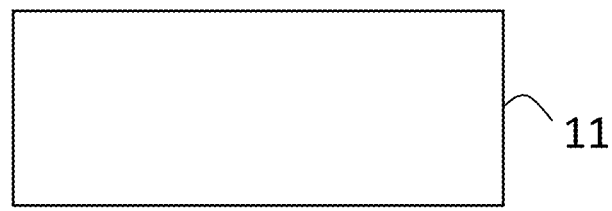
FIG. 11A shows a cross-sectional view of one step included in a fabrication method of the thin film structural body according to an inventive example 4.
Figure 11B:
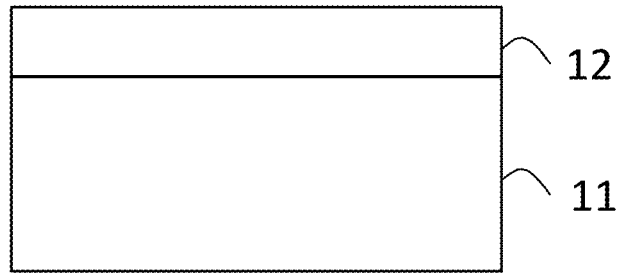
FIG. 11B shows a cross-sectional view of a step of the fabrication method which is subsequent to the step shown in FIG. 11A.
Figure 11C:
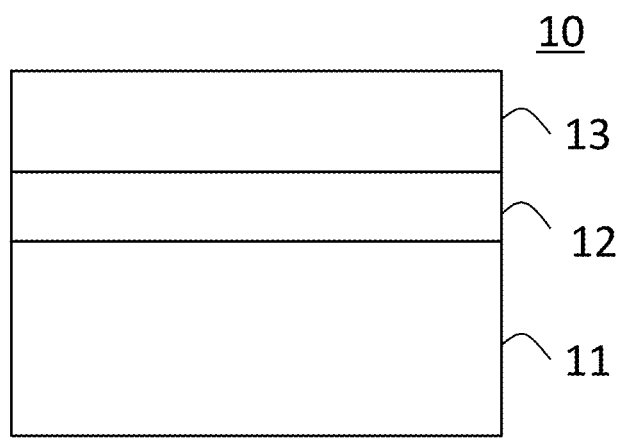
FIG. 11C shows a cross-sectional view of a step of the fabrication method which is subsequent to the step shown in FIG. 11B.

FIG. 11A shows a cross-sectional view of one step included in a fabrication method of the thin film structural body 10 according to the inventive example 4. FIG. 11B and FIG. 11C show cross-sectional views of the steps of the fabrication method which are subsequent to the steps shown in FIG. 11A and FIG. 11B, respectively.

(I) First, as shown in FIG. 11A, a sapphire substrate 11 having a principal plane of a (11-26) plane was prepared.

(II) Then, as shown in FIG. 11B, a first epitaxial thin film 12 having a principal plane of a (100) plane was grown on the (11-26) principal plane of the sapphire substrate 11 similarly to the case of the inventive example 1. In the present inventive example 4, "first epitaxial thin film 12" may be referred to as "NiO first epitaxial thin film 12".

(III) Furthermore, as shown in FIG. 11C, a second epitaxial thin film 13 formed of a platinum monocrystal having a face-centered cubic lattice structure was grown on the (100) principal plane of the NiO first epitaxial thin film 12. A sputterring discharge of 20 W was excited under an atmosphere of an argon gas having a pressure of 3 Pa using a target formed of platinum to grow the second epitaxial thin film 13 on the NiO first epitaxial thin film 12 heated to 500 degrees Celsius. In this way, the thin film structural body 10 according to the inventive example 4 was provided. In the present inventive example 4, "second epitaxial thin film 13" may be referred to as "Pt second epitaxial thin film 13". A Pt monocrystal having a principal plane of a (100) plane has a face-centered cubic lattice structure having a lattice constant a of 0.392 nanometers.

Figure 12:
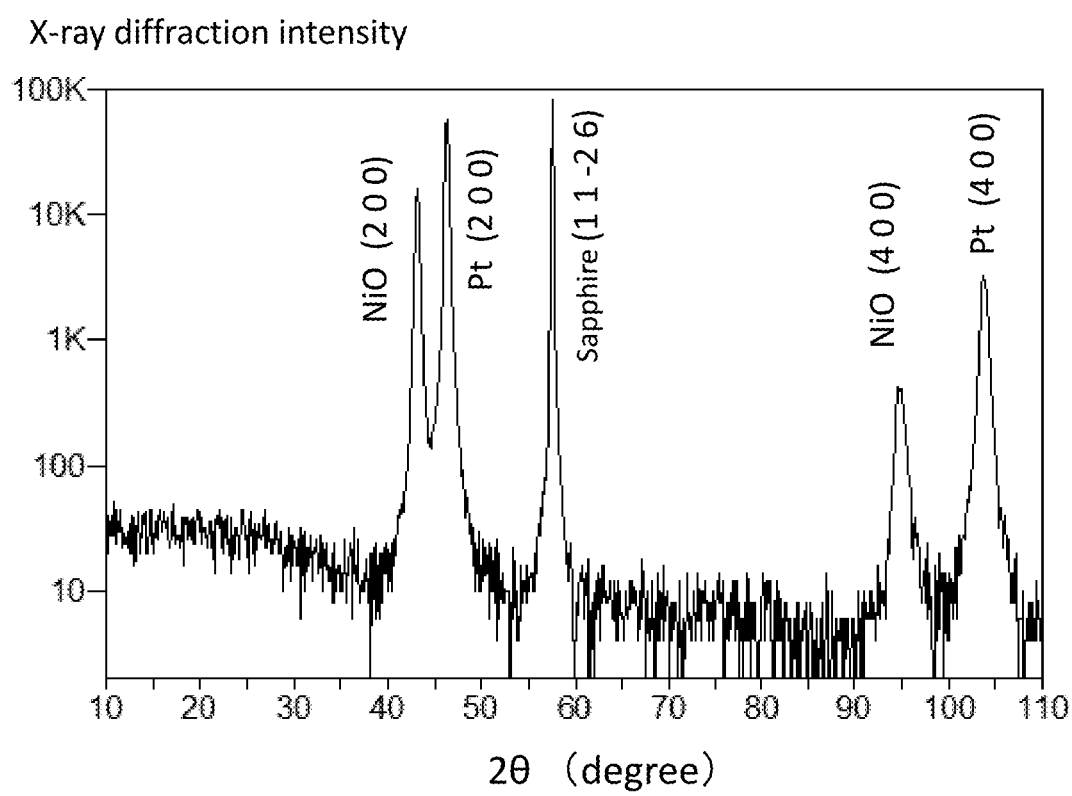
FIG. 12 is an X-ray diffraction graph of the thin film structural body according to the inventive example 4.

FIG. 12 is an X-ray diffraction graph of the thin film structural body 10 according to the inventive example 4. As shown in FIG. 12, only the following five peaks were observed:
(i) a (11-26) peak of the sapphire substrate 11,
(ii) a (200) peak of the NiO first epitaxial thin film 12,
(iii) a (400) peak of the NiO first epitaxial thin film 12,
(iv) a (200) peak of the Pt second epitaxial thin film 13 (2θ=46.3 degrees), and (v) a (400) peak of the Pt second epitaxial thin film 13 (2θ=103.7 degrees).

This means that the Pt second epitaxial thin film 13 having the (100) principal plane was grown in such a manner that the NiO first epitaxial thin film 12 having the (100) principal plane is interposed between the sapphire substrate 11 having the (11-26) principal plane and the Pt second epitaxial thin film 13, as shown in FIG. 11C. The thin film structural body 10 according to the inventive example 4 can be used as an electrode.

As a material of the target, a material having a rock salt crystalline structure or a material having a spinel crystal (e.g., $NiCo_2O_4$) may be used in place of NiO. In place of platinum, iridium, gold, or an alloy thereof may be used. Alternatively, in place of platinum, another metal having a face-centered cubic lattice structure may be used.

Inventive Example 5

Figure 13A:
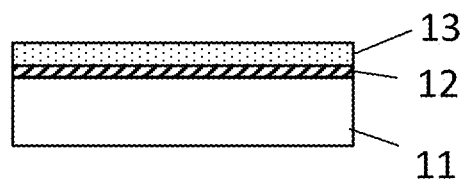
FIG. 13A shows a cross-sectional view of one step included in a fabrication method of a piezoelectric actuator according to an inventive example 5.

In the inventive example 5, a piezoelectric actuator was fabricated using the thin film structural body 10 fabricated in the inventive example 4. FIG. 13A shows a cross-sectional view of one step included in the fabrication method of a piezoelectric actuator 50 according to the inventive example 5. FIG. 13B-FIG. 13E show cross-sectional views of steps included in the fabrication method which are subsequent to the steps shown in FIG. 13A-FIG. 13D.

(I) First, as shown in FIG. 13A, a NiO first epitaxial thin film 12 having a {100} principal plane was grown on a (11-26) principal plane of the sapphire substrate 11 similarly to the case of the inventive example 4. Then, a Pt second epitaxial thin film 13 having a principal plane of a {100} plane was grown on the {100} principal plane of the NiO first epitaxial thin film 12.

Figure 13B:
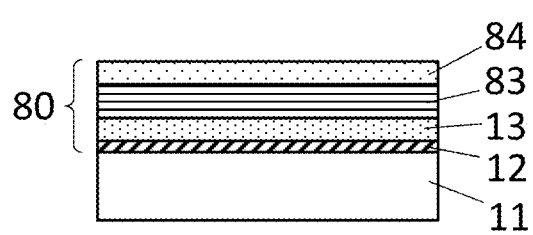
FIG. 13B shows a cross-sectional view of a step of the fabrication method which is subsequent to the step shown in FIG. 13A.

(II) Then, as shown in FIG. 13B, an NBT thin film 83 having a thickness of 2 micrometers was epitaxially grown by a sputtering method on the {100} principal plane of the Pt second epitaxial thin film 12. Furthermore, a gold-chromium alloy layer 84 was vapor-deposited at room temperature on the NBT thin film 83. In this way, a stacking structure 80 was provided.

Figure 13C:
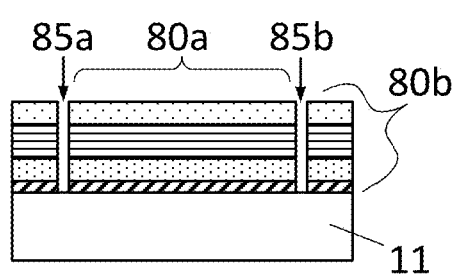
FIG. 13C shows a cross-sectional view of a step of the fabrication method which is subsequent to the step shown in FIG. 13B.

(III) As shown in FIG. 13C, a first groove 85a and a second groove 85b were formed by an argon ion milling method using a mask (not shown) formed by a photoresist method. In this way, the stacking structure 80 was divided into a center region 80a and a periphery region 80b. In a top view, the center region 80a surrounded by the first groove 85a and the second groove 85b had a rectangular shape having a width of 2.5 millimeters and a length of 15 millimeters.

Figure 13D:
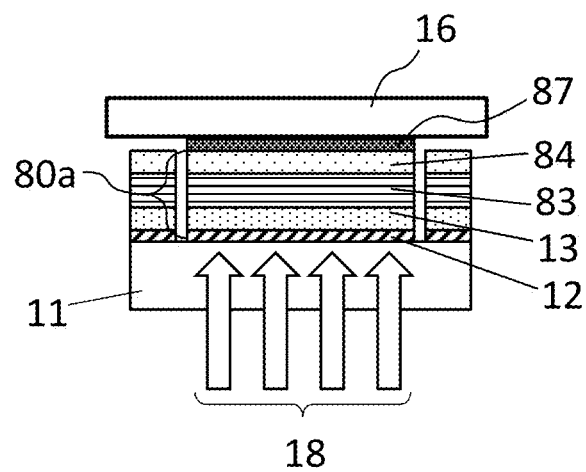
FIG. 13D shows a cross-sectional view of a step of the fabrication method which is subsequent to the step shown in FIG. 13C.

(IV) As shown in FIG. 13D, a gold-plated layer 87 was formed on a part of a region of the back surface of the second substrate 16 formed of a stainless plate having a thickness of 100 micrometers. Then, the gold-chromium alloy layer 84 and the gold-plated layer 87 were brought into contact with each other to provide a stacking structure. The stacking structure was left at rest. In this way, the gold-chromium alloy layer 84 and the gold-plated layer 87 were joined to each other through Au—Au bonds. Subsequently, the back surface of the sapphire substrate 11 was scanned with a KrF excimer laser 18 having a power density of 8 $mJ/mm^2$. In other words, the back surface of the sapphire substrate 11 was irradiated with the KrF excimer laser 18. The laser light was adsorbed onto the back surface of the NiO first epitaxial thin film 12. As a result, the sapphire substrate 11 was peeled (i.e., removed).

Figure 13E:
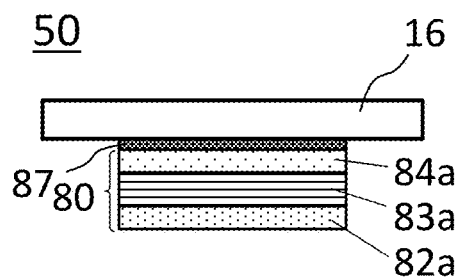
FIG. 13E shows a cross-sectional view of a step of the fabrication method which is subsequent to the step shown in FIG. 13D.

(V) In this way, as shown in FIG. 13E, the NBT thin film 83 grown epitaxially above the sapphire substrate 11 was transferred to the second substrate 16 formed of the stainless plate. In this way, the piezoelectric actuator 50 shown in FIG. 13E was provided.

Figure 14:
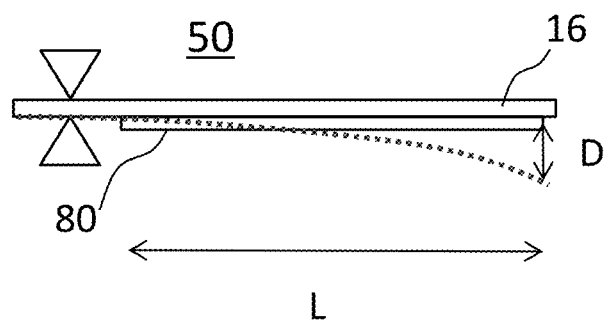
FIG. 14 shows a schematic view of a deformation amount measurement of the piezoelectric actuator according to the inventive example 5.

A voltage of 5 volts was applied between the Pt second epitaxial thin film 13 and the gold-chromium alloy layer 84, which serves as lower and upper electrode layers respectively, to operate the piezoelectric actuator 50 according to the inventive example 5. As shown in FIG. 14, a deformation amount of the piezoelectric actuator 50 according to the inventive example 5 was measured. The piezoelectric actuator 50 according to the inventive example 5 has a length L of 15 millimeters. While one end (i.e., the left end in FIG. 14) of the piezoelectric actuator 50 was fixed, the deformation amount D of the other end (i.e., the right end in FIG. 14) by application of the voltage was measured. As a result, the piezoelectric actuator 50 according to the inventive example 5 had a large deformation amount D of 20 micrometers.

Comparative Example 1

In the comparative example 1, the piezoelectric actuator 50 was fabricated in a similar way to the case of the inventive example 5, except for using a sapphire substrate having a principal plane of a (0001) plane (i.e., c-plane) in place of the sapphire substrate 11 having a (11-26) principal plane. The piezoelectric actuator 50 according to the comparative example 1 had a small deformation amount D of 12 micrometers with regard to the voltage of 5 volts.

INDUSTRIAL APPLICABILITY

The thin film structural body and the method for fabricating thereof according to the present invention can be used to fabricate a device having ferroelectricity, piezoelectricity, pyroelectricity, electrooptic property, electron conductivity, ion conductivity, superconductivity or magnetism. Desirably, the thin film structural body and the method for fabricating thereof according to the present invention can be used to fabricate a piezoelectric actuator. The thin film structural body and the method for fabricating thereof according to the present invention can also be used to fabricate a surface acoustic wave device.

REFERENTIAL SIGNS LIST

10 Thin film structural body
11 Sapphire substrate (namely, First substrate)
12 First epitaxial oxide thin film
13 Second epitaxial thin film
16 Second substrate
18 Laser light
21 Oxygen atom
22 Aluminum atom
23 Nickel atom
24 Interoxygen distance
25 NiO unit lattice length
50 Piezoelectric actuator
60 Layered product
70 Layered product
80 Stacking structure
83 NBT thin film
84 Gold-chromium alloy layer
85 Groove
86 Stainless substrate
87 Gold-plated layer

The invention claimed is:

1. A thin film structural body comprising:
   a sapphire substrate having a principal plane of a {11-26} plane; and
   a first epitaxial thin film which is grown directly on the principal plane of the sapphire substrate,
   wherein
   the first epitaxial thin film is formed of an oxide; and
   the first epitaxial thin film has a principal plane of a {100} plane.

2. The thin film structural body according to claim 1, wherein
   a <1-100> axis of the sapphire substrate is parallel to a <110> axis of the first epitaxial thin film.

3. The thin film structural body according to claim 1, wherein
   the first epitaxial thin film has one crystalline structure selected from the group consisting of a rock saltline crystalline structure, a spinel crystalline structure, and a perovskite crystalline structure.

4. The thin film structural body according to claim 1, wherein
   the following mathematical formula (I) is satisfied:

$$0.35n \text{ nanometers} \le a \le 0.47n \text{ nanometers} \quad (I)$$

where
   a represents a lattice constant of the first epitaxial thin film, and
   n represents a natural number.

5. The thin film structural body according to claim 1, wherein
   the first epitaxial thin film is formed of one material selected from the group consisting of nickel oxide, nickel cobaltite, and sodium bismuth barium titanate.

6. The thin film structural body according to claim 1, further comprising:
   a second epitaxial thin film which is grown on the principal plane of the {100} plane of the first epitaxial thin film and has a principal plane of a {100} plane.

7. A method for fabricating a thin film structural body, the method comprising:
   (a) growing a first epitaxial thin film on a principal plane of a first substrate which is a sapphire substrate,
   wherein
   the principal plane of the sapphire substrate is a {11-26} plane;
   the first epitaxial thin film is formed of an oxide; and
   the first epitaxial oxide film has a principal plane of a {100} plane.

8. The method according to claim 7, further comprising:
   (b) bringing the principal plane of the {100} plane of the first epitaxial thin film into contact with a second substrate; and
   (c) irradiating the first epitaxial thin film with laser light to separate the sapphire substrate from the first epitaxial thin film,
   wherein
   in the step (c), the first epitaxial thin film is irradiated with the laser light in such a manner that the laser light passes through an inside of the sapphire substrate.

9. The method according to claim 7, further comprising:
   (b) growing a second epitaxial thin film on the principal plane of the {100} plane of the first epitaxial thin film;
   wherein the second epitaxial thin film has a principal plane of a {100} plane,
   (c) bringing the principal plane of the {100} plane of the second epitaxial thin film into contact with a second substrate; and
   (d) irradiating the first epitaxial thin film with laser light to separate the sapphire substrate from the first epitaxial thin film,
   wherein
   in the step (d), the first epitaxial thin film is irradiated with the laser light in such a manner that the laser light passes through an inside of the sapphire substrate.

10. The method according to claim 9, further comprising:
    (e) removing the first epitaxial thin film with the laser light.

11. The method according to claim 7, wherein
    the first epitaxial thin film contains nickel or iron.

12. The method according to claim 7, wherein
    the first epitaxial thin film is formed of one material selected from the group consisting of nickel oxide, nickel cobaltite, and sodium bismuth barium titanate.

* * * * *